United States Patent
Wu et al.

(10) Patent No.: US 6,399,503 B1
(45) Date of Patent: Jun. 4, 2002

(54) METHOD OF PREVENTING DISHING PHENOMENON ATOP A DUAL DAMASCENE STRUCTURE

(75) Inventors: Kun-Lin Wu, Hsin-Chu Hsien; J. J. Huang, Hsin-Chu, both of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/764,329

(22) Filed: Jan. 19, 2001

(51) Int. Cl.$^7$ ............................................. H01L 21/302
(52) U.S. Cl. ........................ 438/692; 438/687; 438/652; 438/653; 438/697; 438/704; 438/720; 438/725; 438/749
(58) Field of Search ................................ 438/692, 697, 438/704, 720, 725, 749, 652, 653, 687

(56) References Cited

U.S. PATENT DOCUMENTS

| | | | | |
|---|---|---|---|---|
| 4,833,519 A | * | 5/1989 | Kawtano | 357/59 |
| 5,776,833 A | * | 7/1998 | Chen et al. | 438/672 |
| 6,051,496 A | * | 4/2000 | Jang | 438/687 |
| 6,107,193 A | * | 8/2000 | Shiao et al. | 438/684 |
| 6,171,963 B1 | * | 1/2001 | Wang | 438/692 |

\* cited by examiner

*Primary Examiner*—George Goudreau
(74) *Attorney, Agent, or Firm*—Winston Hsu

(57) ABSTRACT

The present invention provides a method of preventing the dishing phenomenon occurring atop a dual damascene structure on a semiconductor wafer. The semiconductor has a substrate, a first dielectric layer positioned on the substrate, a dual damascene hole positioned in the first dielectric layer through to the surface of the substrate, a barrier layer covering the surface of the first dielectric layer and both the surface of the walls and bottom of the dual damascene hole, and a copper layer positioned on the barrier layer and filling the dual damascene hole to form the dual damascene structure. The method first involves performing a first chemical mechanical polishing (CMP) process to remove portions of the copper layer down to the surface of the barrier layer. A photoresist layer is then formed atop the dual damascene structure to remove portions of the barrier layer uncovered by the photoresist layer. Finally, a second CMP process is performed to remove portions of the copper layer so as to align the top of the copper layer in the dual damascene structure with the surface of the first dielectric layer after the photoresist layer is stripped.

12 Claims, 5 Drawing Sheets

METHOD OF PREVENTING DISHING PHENOMENON ATOP A DUAL DAMASCENE STRUCTURE

BACKGROUND OF THE INVENTION

1. Field of the invention

The present invention relates to a method of preventing the dishing phenomenon occurring atop a dual damascene structure of a semiconductor that causes the premature breakdown of a capacitor device.

2. Description of the Prior Art

A dual damascene process is the method of forming a conductive wire coupled with a plug. The dual damascene structure is used to connect devices and wires in a semiconductor wafer and insulated from other devices by surrounding inter-layer dielectrics (ILD).

Following the completion of the dual damascene process, a chemical mechanical polishing (CMP) process is always performed to planarize the surface of the semiconductor wafer and allow for subsequent deposition and photolithographic processes to be properly performed on the wafer and form good multilevel interconnects. As a result, the dual damascene structure is widely applied in the manufacturing process of integrated circuits. Thus, advancement in integrated circuit technology makes the improving of the yield of the dual damascene structure an important issue in the manufacturing process of integrated circuits.

Please refer to FIG. 1 to FIG. 4 of cross-sectional views of manufacturing a MOS capacitor 28 according to the prior art. As shown in FIG. 1, a semiconductor wafer 10 has a substrate 12, a first dielectric layer 14 composed of silicon dioxide positioned on the surface of the substrate 12, and a dual damascene hole 16. The dual damascene hole 16 consists of both a plug hole and a wire recess, stacked on the plug hole, positioned in the first dielectric layer 14 through to the surface of the substrate 12.

As shown in FIG. 2, the method of manufacturing the MOS capacitor 28 according to the prior art first involves the formation of a barrier layer 18 covering the surface of the first dielectric layer 14 and the surfaces of both the walls and bottom of the dual damascene hole 16, on the surface of the semiconductor wafer 10. A physical vapor deposition (PVD) process is then performed to form a seed layer (not shown) on the surface of the barrier layer 18, composed of tantalum (Ta), tantalum nitride (TaN), titanium nitride (TiN), titanium (Ti), or metal materials with high melting points. By performing an electrical copper plating (ECP) process, a copper layer 20 is filled into the dual damascene hole 16 to form a dual damascene structure 22 on the surface of the seed layer covering the barrier layer 18.

As shown in FIG. 3, a first CMP process is performed to remove portions of the copper layer 20 down to the surface of the first dielectric layer 14. The surface of the copper layer 20 atop the dual damascene structure 22 is thus approximately aligned with that of the first dielectric layer 14. As shown in FIG. 4, a second dielectric layer 24 made of an oxide-nitride-oxide (ONO) material, silicon nitride or materials with high effective dielectric constants, is formed on the surface of the semiconductor wafer 10. A metal layer 26 is then formed in a predetermined area on the second dielectric layer 24 to complete the manufacturing of the MOS capacitor 28 comprised of the copper layer 20, the second dielectric layer 24 and the metal layer 26.

However, in the method of manufacturing the MOS capacitor 28 according to the prior art, the removal rate of the copper metal layer 20 is greater than that of the barrier layer 18. As a result, the surface the copper metal layer 20 atop the dual damascene structure 22 is slightly lower than that of the first dielectric layer 14 to result in the dishing phenomenon. As well, the protrusion caused by the remaining barrier layer 18 at the interface of the first dielectric layer 14 and the copper layer 20 creates both the tip effect and a defect in the second dielectric layer 24 to induce premature breakdown of the MOS capacitor.

SUMMARY OF THE INVENTION

It is therefore a primary object of the present invention to provide a method of preventing the dishing phenomenon on a semiconductor wafer, more specifically, to provide a method of preventing the dishing phenomenon occurring on a dual damascene structure of a semiconductor wafer.

In the preferred embodiment of the present invention, a semiconductor has a substrate, a first dielectric layer positioned on the substrate, a dual damascene hole positioned in the first dielectric layer through to the surface of the substrate, a barrier layer covering the surface of the first dielectric layer and the surfaces of both the walls and bottom of the dual damascene hole, and a copper layer positioned on the barrier layer and filling the dual damascene hole to form the dual damascene structure. The method of the present invention first involves performing a first chemical mechanical polishing (CMP) process to remove portions of the copper layer down to the surface of the barrier layer. A photoresist layer is then formed atop the dual damascene structure and portions of the barrier layer uncovered by the photoresist layer are then removed. A second CMP process is performed to remove portions of the copper layer so as to align the top of the copper layer in the dual damascene structure with the surface of the first dielectric layer following the stripping of the photoresist layer. A second dielectric layer, made of an oxide-nitride-oxide (ONO) material, silicon nitride or materials with high effective dielectric constants, is then formed on the surface of the semiconductor wafer. Finally, a metal layer is formed in a predetermined area on the second dielectric layer to complete the manufacturing of the MOS capacitor comprising of the copper layer, the second dielectric layer and the metal layer It is an advantage of the present invention over the prior art that the dishing phenomenon caused by differences in the removal rate of both the copper layer and the barrier layer is prevented. As well, the present invention aligns the surface of the copper layer with that of the first dielectric layer atop the dual damascene structure so that protrusion, leading to the tip effect, at the interface of the first dielectric layer and the copper layer is also prevented. Therfore, the premature breakdown of the MOS capacitor as a result of the tip effect is prevented to increase both the efficiency and reliability of the MOS capacitor.

These and other objectives of the present invention will no doubt become obvious to those of ordinary skill in the art after reading the following detailed description of the preferred embodiment, which is illustrated in the multiple figures and drawings.

DETAILED DESCRIPTION OF THE PREFERRED EMBODIMENT

Figure 1:
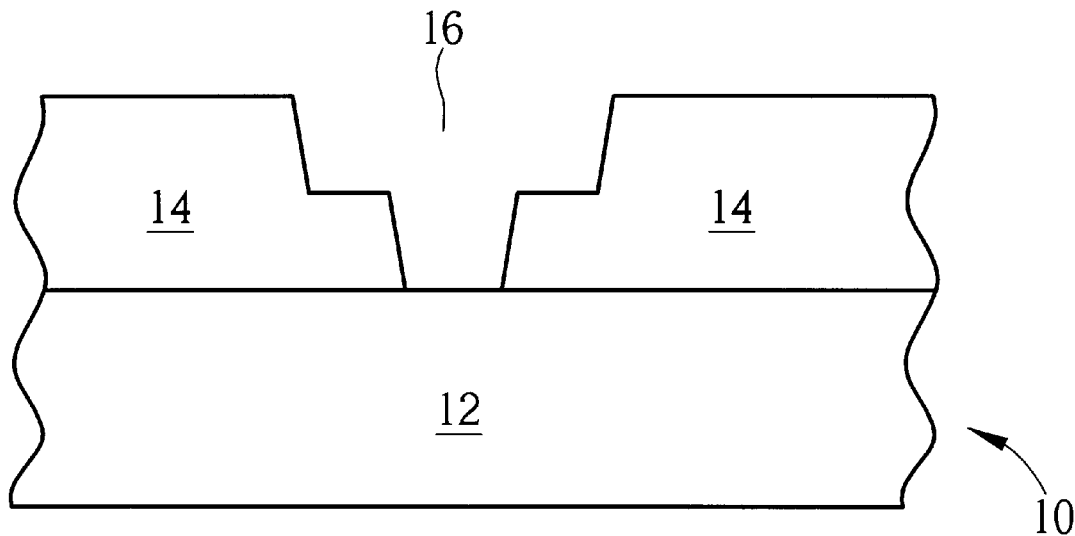
FIG. 1 to FIG. 4 are the cross-sectional views of manufacturing a MOS capacitor according to the prior art.
Figure 2:
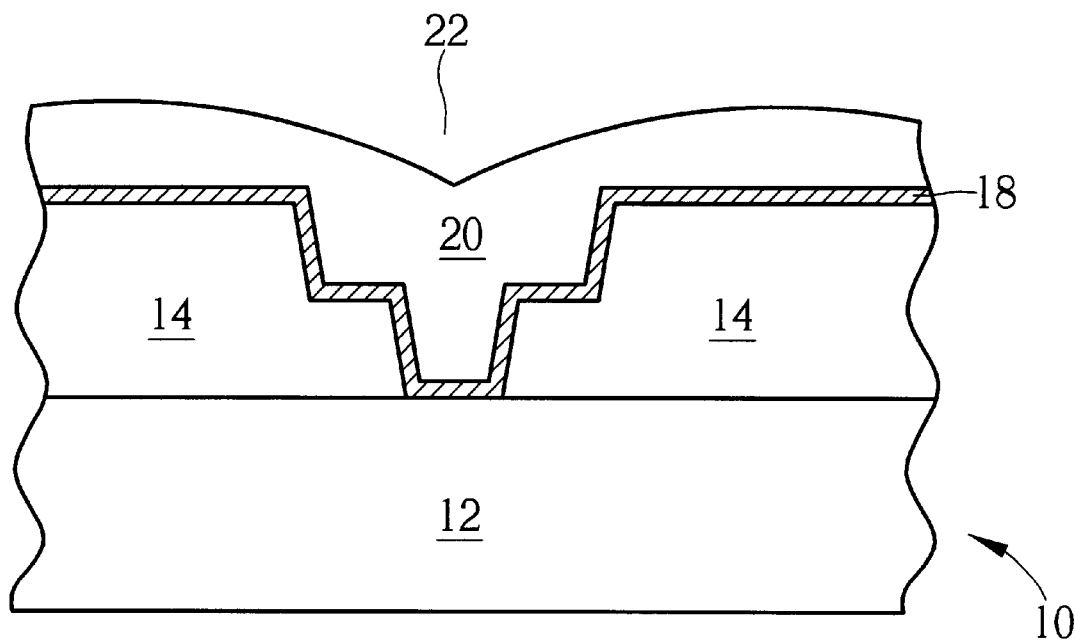
Figure 3:
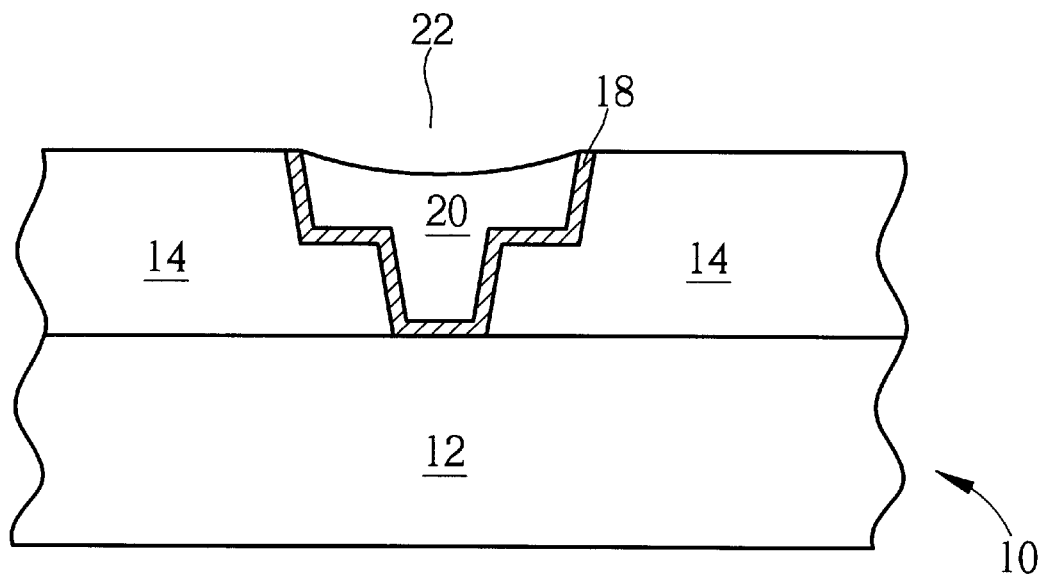
Figure 4:
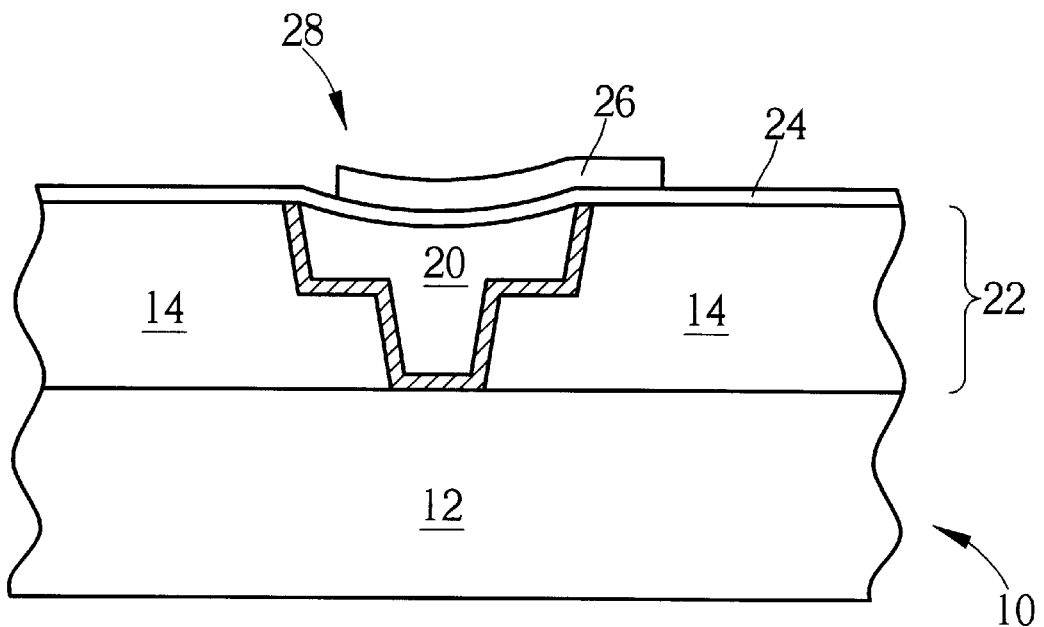
Figure 5:
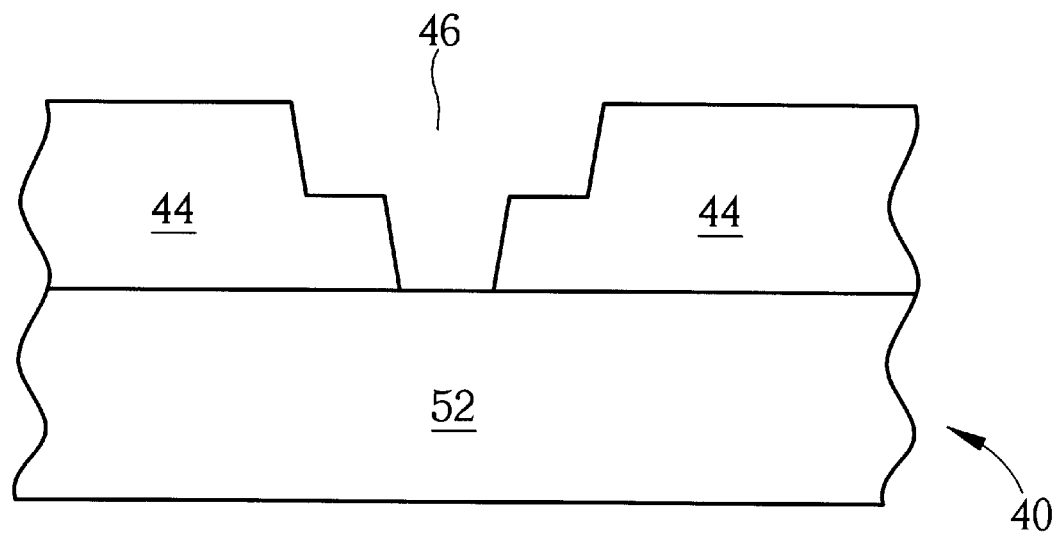
FIG. 5 to FIG. 10 are the cross-sectional views of manufacturing a MOS capacitor according to the present invention.

Please refer to FIG. 5 to FIG. 10 of the cross-sectional views of manufacturing a MOS capacitor according to the present invention. As shown in FIG. 5, a semiconductor wafer 40 has a substrate 52, a first dielectric layer 44 composed of silicon dioxide positioned on the surface of substrate 52, and a dual damascene hole 46. The dual damascene hole 46 consists of a plug hole and a wire recess, stacked on the plug hole, positioned in the first dielectric layer 44 through to the surface of the substrate 52.

Figure 6:
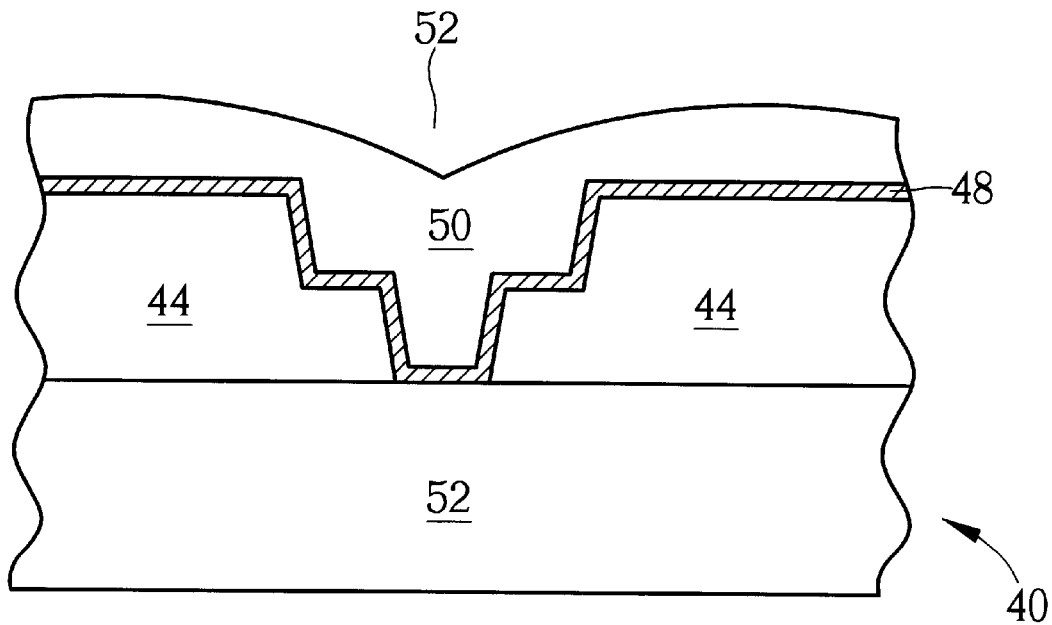

As shown in FIG. 6, the method of manufacturing the MOS capacitor 28 according to the present invention first involves the formation of a barrier layer 48, covering the surface of the first dielectric layer 44 and the surface of both the walls and bottom of the dual damascene hole 46, on the surface of the semiconductor wafer 40. A physical vapor deposition (PVD) process is then performed to form a seed layer (not shown) on the surface of the barrier layer 48, composed of tantalum (Ta), tantalum nitride (TaN), titanium nitride (TiN), titanium (Ti), or metal materials with high melting points. By performing an electrical copper plating (ECP) process, a copper layer 50 fills in the dual damascene hole 46 to form a dual damascene structure 52 on the surface of the seed layer covering the barrier layer 48.

Figure 7:
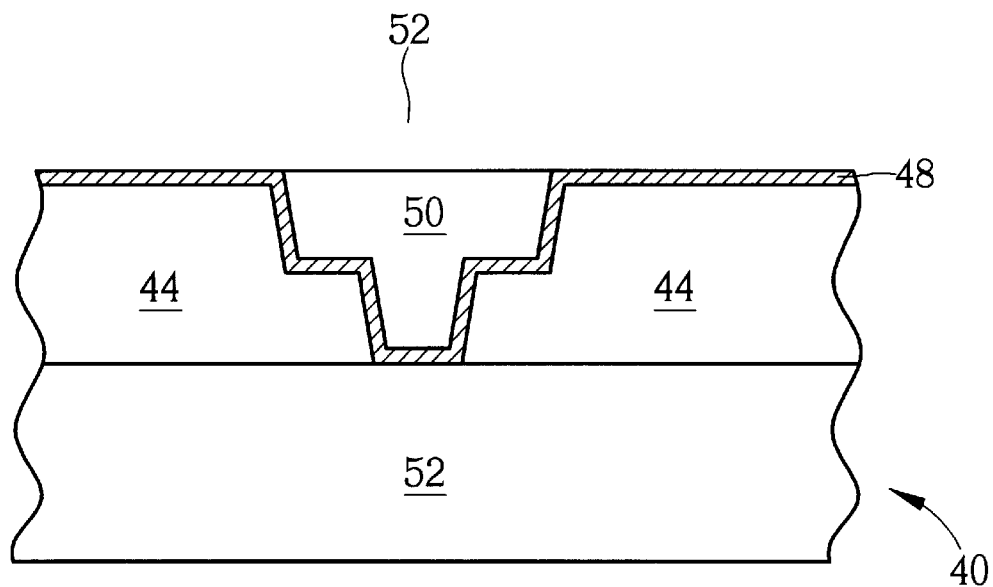
Figure 8:
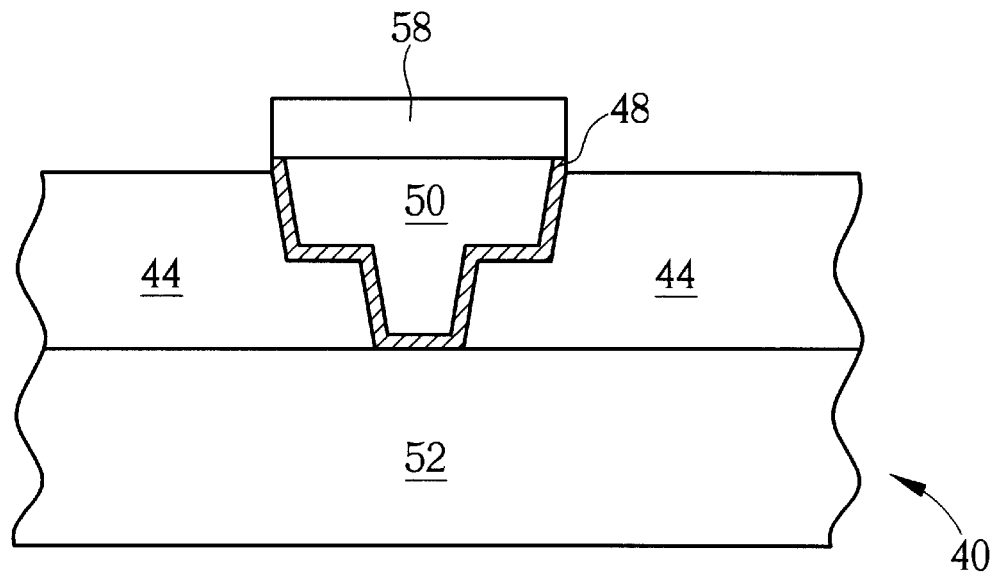
Figure 9:
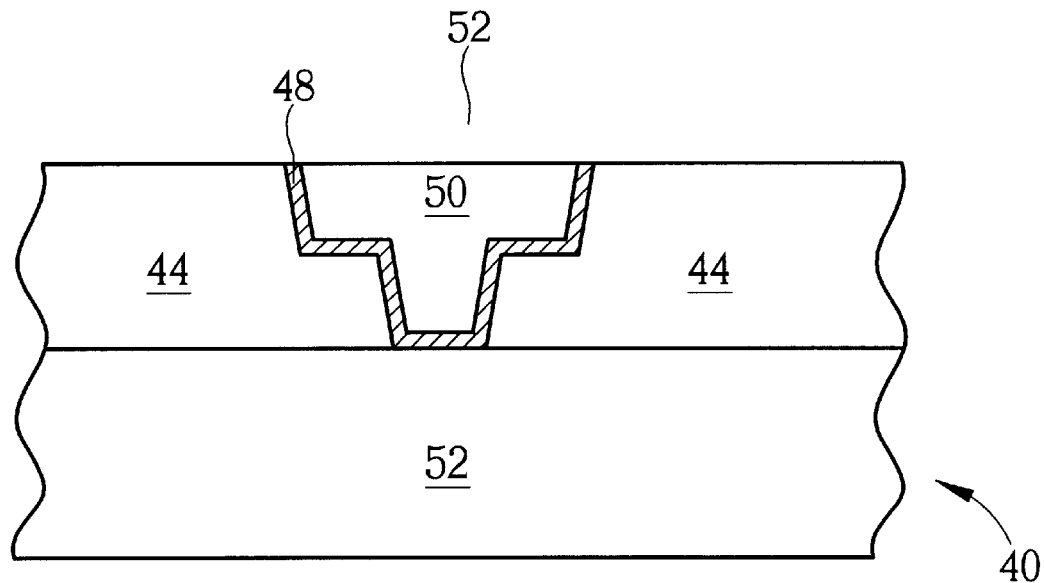

As shown in FIG. 7, a first CMP process is performed to remove portions of the copper layer 50 down to the surface of the barrier layer 48. As shown in FIG. 8, a photoresist layer 58 is formed atop the dual damascene structure 52. Portions of the barrier layer 48 uncovered by the photoresist layer 58 is then removed using an etching process. As shown in FIG. 9, after removing the photoresist layer 58, a second CMP process is performed to remove portions of the copper layer 50 down to the surface of the first dielectric layer 44. The surface of the copper layer 50 atop the dual damascene structure 52 is thus approximately aligned with that of the first dielectric layer 44.

Figure 10:
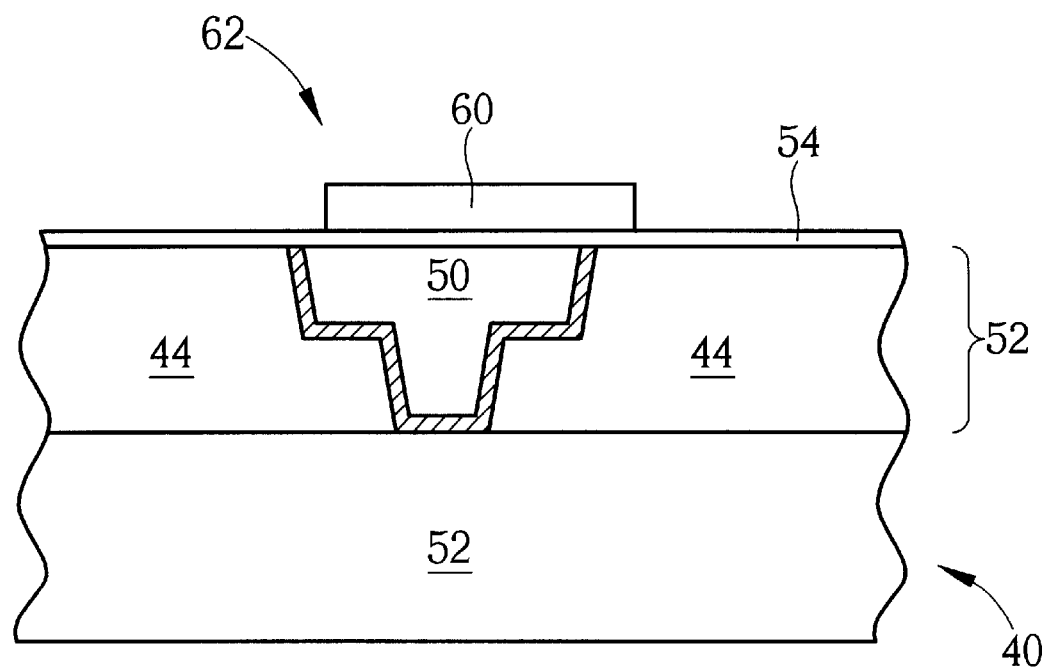

Finally, as shown in FIG. 10, a second dielectric layer 54 made of an oxide-nitride-oxide (ONO) structured material, silicon nitride or materials with high effective dielectric constants, is formed on the surface of the semiconductor wafer 40. A metal layer 60 is then formed in a predetermined area on the second dielectric layer 54 to complete the manufacturing of the MOS capacitor 62 comprising of the copper layer 50, the second dielectric layer 54 and the metal layer 60.

In comparison with the prior art, the present invention provides a method of preventing the dishing phenomenon on a semiconductor wafer during the manufacturing of a MOS capacitor. The method of the present invention involves first performing a first CMP process to remove portions of the copper layer down to the surface of the barrier layer. Thereafter, a second CMP process is performed following the removal of the barrier layer outside the dual damascene hole, to remove portions of the copper layer down to the surface of the first dielectric layer. The dishing phenomenon caused by differences in the removal rate of both the copper layer and the barrier layer is thus prevented. As well, since the surface of the copper layer is aligned with that of the first dielectric layer atop the dual damascene structure, the tip effect caused by protrusion occurring at the interface of the first dielectric layer and the copper layer is prevented as well. Therefore, the premature breakdown of the MOS capacitor caused by the tip effect no longer occurs to increase both the efficiency and the reliability of the MOS capacitor.

Those skilled in the art will readily observe that numerous modifications and alterations of the device may be made while retaining the teachings of the invention. Accordingly, the above disclosure should be construed as limited only by the metes and bound of the appended claims.

What is claimed is:

1. A method of preventing dishing phenomenon on top of a dual damascene structure on a semiconductor wafer, the semiconductor wafer comprising a substrate, a first dielectric layer positioned on the substrate, a dual damascene hole positioned in the first dielectric layer and through to the surface of the substrate, a barrier layer covering the surface of the first dielectric layer, the surface of the walls within the dual damascene hole, and the surface of a bottom within the dual damascene hole, and a copper layer positioned on the barrier layer and filling the dual damascene hole to form the dual damascene structure, the method comprising:

performing a first chemical mechanical polishing (CMP) process to remove portions of the copper layer, and stopping on the surface of the barrier layer;

forming a photoresist layer on top of the dual damascene structure;

removing portions of the barrier layer not covered by the photoresist layer;

stripping the photoresist layer; and performing a second chemical mechanical polishing (CMP) process to remove portions of the copper layer so as align the top of the copper layer in the dual damascene structure with the surface of the first dielectric layer.

2. The method of claim 1 wherein the dual damascene hole consists of a plug hole and a wire recess stacked on the plug hole.

3. The method of claim 1 wherein the barrier layer comprises a tantalum (Ta) layer and a tantalum nitride (TaN) layer.

4. The method of claim 1 wherein the barrier layer comprises either tantalum (Ta), tantalum nitride (TaN), titanium nitride (TiN), titanium (Ti) or refractory metals.

5. The method of claim 1 wherein the first dielectric layer comprises silicon dioxide.

6. The method of claim 1 wherein the method further comprises the following steps after the second CMP process:

forming a second dielectric layer on the semiconductor wafer; and forming a metal layer on a region of the second dielectric layer, with the copper layer, the second dielectric layer and the metal layer forming a metal capacitor.

7. A method of forming a metal capacitor on a semiconductor wafer, the semiconductor wafer comprising a substrate, a first dielectric layer positioned on the substrate, a dual damascene hole positioned in the first dielectric layer and through to the surface of the substrate, a barrier layer covering the surface of the first dielectric layer, the surface of the walls within the dual damascene hole, and the surface of a bottom within the dual damascene hole, and a first metal layer positioned on the barrier layer and filling in the dual damascene hole to form the dual damascene structure, the method comprising:

performing a first chemical mechanical polishing (CMP) process to remove portions of the copper layer, and stopping on the surface of the barrier layer;

forming a photoresist layer on top of the dual damascene structure;

removing portions of the barrier layer not covered by the photoresist layer;

stripping the photoresist layer;

performing a second chemical mechanical polishing (CMP) process to remove portions of the first metal layer so as to align the top of the first metal layer in the dual damascene structure with the surface of the first dielectric layer;

forming a second dielectric layer on the semiconductor wafer; and forming a second metal layer on a region of the second dielectric layer, with the first metal layer, the second dielectric layer and the second metal layer forming a metal capacitor.

8. The method of claim 7 wherein the dual damascene hole consists of a plug hole and a wire recess stacked on the plug hole.

9. The method of claim 7 wherein the barrier layer comprises a tantalum (Ta) layer and a tantalum nitride (TaN) layer.

10. The method of claim 7 wherein the barrier layer comprises either tantalum (Ta), tantalum nitride (TaN), titanium nitride (TiN), titanium (Ti) or refractory metals.

11. The method of claim 7 wherein the first dielectric layer comprises silicon dioxide.

12. The method of claim 7 wherein the second dielectric layer comprises either an oxide-nitride-oxide (ONO) structured material, silicon nitride or materials with high effective dielectric constants.

* * * * *